United States Patent [19]
Caldwell et al.

[11] Patent Number: 5,239,152
[45] Date of Patent: Aug. 24, 1993

[54] TOUCH SENSOR PANEL WITH HIDDEN GRAPHIC MODE

[75] Inventors: David W. Caldwell; Nicholas W. Medendorp, both of Holland, Mich.

[73] Assignee: Donnelly Corporation, Holland, Mich.

[21] Appl. No.: 605,497

[22] Filed: Oct. 30, 1990

[51] Int. Cl.[5] .................. H03K 17/98; H01H 9/16; H01H 9/18
[52] U.S. Cl. .................................. 200/600; 200/5 R
[58] Field of Search ............ 200/5 R, 5 A, 600, 52 R, 200/511, 512, 310, 311, 313, 317; 341/22; 340/711, 712, 718, 760, 762, 780

[56] References Cited

U.S. PATENT DOCUMENTS

| | | | |
|---|---|---|---|
| 3,777,222 | 5/1972 | Harris | 317/112 |
| 4,056,699 | 11/1977 | Jordan | 200/5 |
| 4,374,381 | 2/1983 | Ng et al. | 340/711 |
| 4,413,252 | 11/1983 | Tyler et al. | 340/365 |
| 4,529,968 | 7/1985 | Hilsum et al. | 340/365 |
| 4,550,310 | 10/1985 | Yamaguchi et al. | 340/365 |
| 4,614,937 | 9/1986 | Poujois | 340/365 |
| 4,731,694 | 3/1988 | Grabner et al. | 361/280 |
| 4,736,190 | 4/1988 | Fiorella | 340/365 |
| 4,740,781 | 4/1988 | Brown | 340/712 |
| 4,743,985 | 5/1988 | Alexander | 340/712 |
| 4,855,550 | 8/1989 | Schultz, Jr. | 200/600 |
| 4,894,493 | 1/1990 | Smith et al. | 200/5 |
| 4,901,074 | 2/1990 | Sinn et al. | 341/22 |
| 4,990,901 | 2/1991 | Beiswenger | 340/712 |
| 4,991,940 | 2/1991 | Dalisa et al. | 350/338 |

Primary Examiner—A. D. Pellinen
Assistant Examiner—Michael A. Friedhofer
Attorney, Agent, or Firm—Price, Heneveld, Cooper, DeWitt & Litton

[57] ABSTRACT

A capacitive touch sensor panel includes a generally planar substrate, a graphic layer behind the substrate defining user readable graphic symbols and a light source behind the graphic layer including individual selectively actuatable light elements behind particular ones of the graphic symbols. A flexible substrate supporting a plurality of electrically capacitive sensing pads are juxtaposed with the graphic symbols in a manner that functions associated with the sensing pads are invoked by actuation of the sensing pads overlaying the corresponding symbol. The substrate has optical transmission characteristics at selected light frequencies in order to project images of the graphic symbols juxtaposed with actuated light elements and to impart a homogeneous appearance to portions of the substrate overlying nonactuated light elements, the later defining a "sleep mode" in which the touch panel blends in with surrounding surfaces.

22 Claims, 3 Drawing Sheets

TOUCH SENSOR PANEL WITH HIDDEN GRAPHIC MODE

BACKGROUND OF THE INVENTION

This invention relates generally to touch sensor panels of the type that respond to contact by a user to provide an input to a control circuit and more particularly to a touch panel having graphics to indicate the functions associated with a particular portion of the touch sensor panel.

The use of capacitive touch sensor panels as an input device for various applications is well known. In order to associate a particular function being invoked by the actuation of one particular touch pad, a graphic symbol is located on the touch panel juxtaposed with the associated switch. While efforts are made to make the graphics pleasing in appearance, their presence tends to be obtrusive when used in design concepts attempting to achieve clean, non-functional lines. In such application, it may be desirable to provide a control panel that completely blends into the background in order to disguise the presence of the control panel until its use is required.

One approach to impart a pleasing appearance to a touch panel is suggested in U.S. Pat. No. 4,855,550 issued to Schultz, Jr. In the Schultz, Jr. patent, outer electrodes of finely ground glass black glass particles and a conductive metal powder are covered with a non-conductive white ceramic enamel to hide the dark color of the electrode except for a small exposed area which may define a graphic symbol. The exposed area provides a touch pad for contact by a human body member. Although the touch panel disclosed in Schultz, Jr. may have an overall light-colored appearance, the graphic symbols remain visible at all times, and hence obtrusive. Furthermore, the efforts to reduce the obtusiveness of the graphics has a tendency to interfere with their functionality.

SUMMARY OF THE INVENTION

The present invention provides a capacitive touch sensor panel with graphic information that is normally hidden, and hence, unobtrusive but which "comes alive" to provide a functional interactive input device when needed.

A capacitive touch sensor panel according to the invention includes a generally planar substrate having a user contacting first surface and an opposite second surface. An alpha-numeric or icon graphics layer is provided behind the second surface defining user readable graphic symbols. Capacitive sensor means are juxtaposed with the alpha-numeric or other graphic symbols that relate to the function associated with the switch means. An optical filter for transmitting selected light frequencies is provided between the user contacting first surface and the graphic layer. A light source behind the graphics layer is selectively actuatable to cause the juxtaposed graphic symbol or alpha-numeric characters to appear. When the light source is not actuated, the touch panel has a homogeneous appearance of a plane panel whose color is determined by the absorption characteristics of the optical filter and the graphics are substantially hidden.

The optical filter may be provided as a colored layer on the surface of the substrate opposite the user contacting surface or maybe a tint applied to the material making up the substrate. Substantially transparent conductive touch pad may be applied to the user-contacting surface for certain applications and will not distort the overall homogeneous appearance of the touch panel. The graphic symbols in the graphic layer may be opaque and therefore appear black when the light source is actuated or the graphics layer may be black with the graphic symbols transparent such that they appear the color of the optical filter when the light source is actuated.

These and other objects, advantages and features of this invention will become apparent upon review of the following specification in conjunction with the drawings.

DESCRIPTION OF THE PREFERRED EMBODIMENT

Figure 1A:
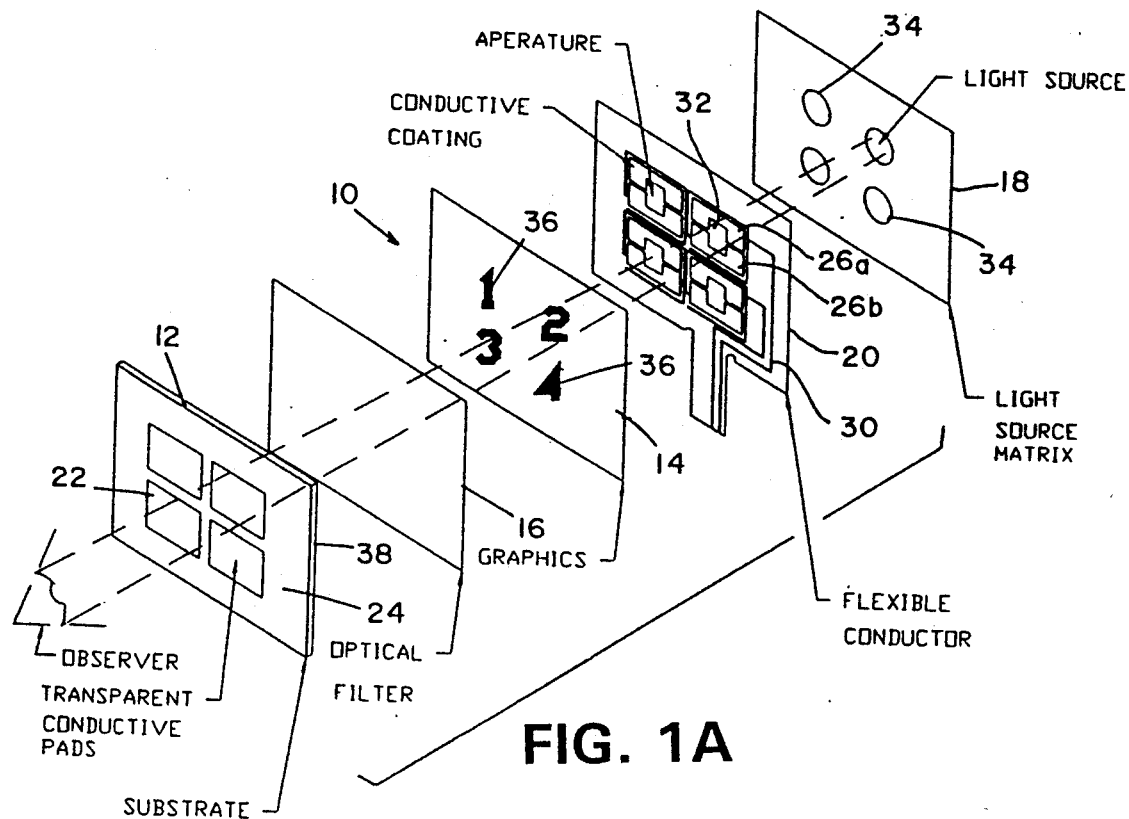
FIG. 1A is an exploded perspective view of a touch panel using one form of graphic symbols.

Referring now specifically to the drawings and the illustrative embodiments depicted therein, a capacitive touch sensor panel, generally illustrated at 10, includes a generally planar dielectric substrate 12, a graphic layer 14, an optical filter 16 located between the substrate and the graphic layer, a light source matrix 18 behind the graphics layer 14 and a capacitive switch sensing assembly 20. Touch sensor panel 10 may be used in association with various known forms of touch detection circuits. One such circuit responds to the attenuation of pulses as a result of user contact of the substrate. In such application, a plurality of transparent conductive pads 22 are provided on a user contact surface 24 of substrate 12. Each pad 22 overlies an associated pair of sensing pads 26a, 26b on sensing assembly 20. Such a touch detecting circuit is disclosed in commonly-owned U.S. Pat. No. 5,189,417 for a DETECTION CIRCUIT FOR MATRIX TOUCH PAD by the present inventors, the disclosure of which is hereby incorporated herein by reference.

Capacitive touch sensing assembly 20 includes a dielectric layer or substrate 20, made from a flexible material, such as polyester, upon which sensor pads 26a, 26b and associated input and output lead-lines 30 are printed on one surface thereof. In the illustrated embodiment, sensor pads 26a and 26b are opaque and, accordingly, a cutout portion 32 is provided in each pad in order to define an aperture through which light from light source matrix 18 may pass. Sensor pads 26a, 26b could, alternatively, be made from a substantially transparent material, such as that used for conductive pads 22, in which case cutouts 32 would not be required. Light source matrix 18 includes a plurality of individual light sources 34 which are selectively actuatable by the control circuit (not shown) for which touch panel 10 is used as an input device and/or an output device requiring/soliciting a touch response. Each light source 34, when actuated, causes an overlaying alpha-numeric character or icon graphic symbol 36 to become visible through substrate 12. When a particular light source 34 is not actuated, the overlaying alpah-numeric character of icon graphic symbol 36 is hidden and the overlaying portion of substrate 12 takes on the appearance of a smooth panel having a color determined by the transmissive characteristics of optical filter 16. It should be understood that references in this description to "color" are intended to be inclusive and are not intended to exclude white and gray.

In the embodiment illustrated in FIG. 1A, substrate 12 is made from lime-soda glass or polycarbonate. Optical filter 16 may be a colored coating such as an epoxy or a colored frit applied to a rear surface 38 of substrate 12 opposite touch surface 24. Graphic layer 14 may be a transparent film having opaque alpha-numeric characters or icon graphic symbols 36 printed thereon or may be opaque characters deposited directly on optical filter 16. Conductive pads 22 may be tin antimony oxide or indium tin oxide, applied to surface 24 in a manner that is well known in the art. Capacitive switch sensing assembly 20 may be adhered to substrate 12 over optical filter layer 16 and graphic layer 14 by a transparent adhesive. Light sources 34 are preferable light-emitting diodes positioned within an enclosure (not shown) which, when covered by touch panel 10, is light tight.

Figure 1B:
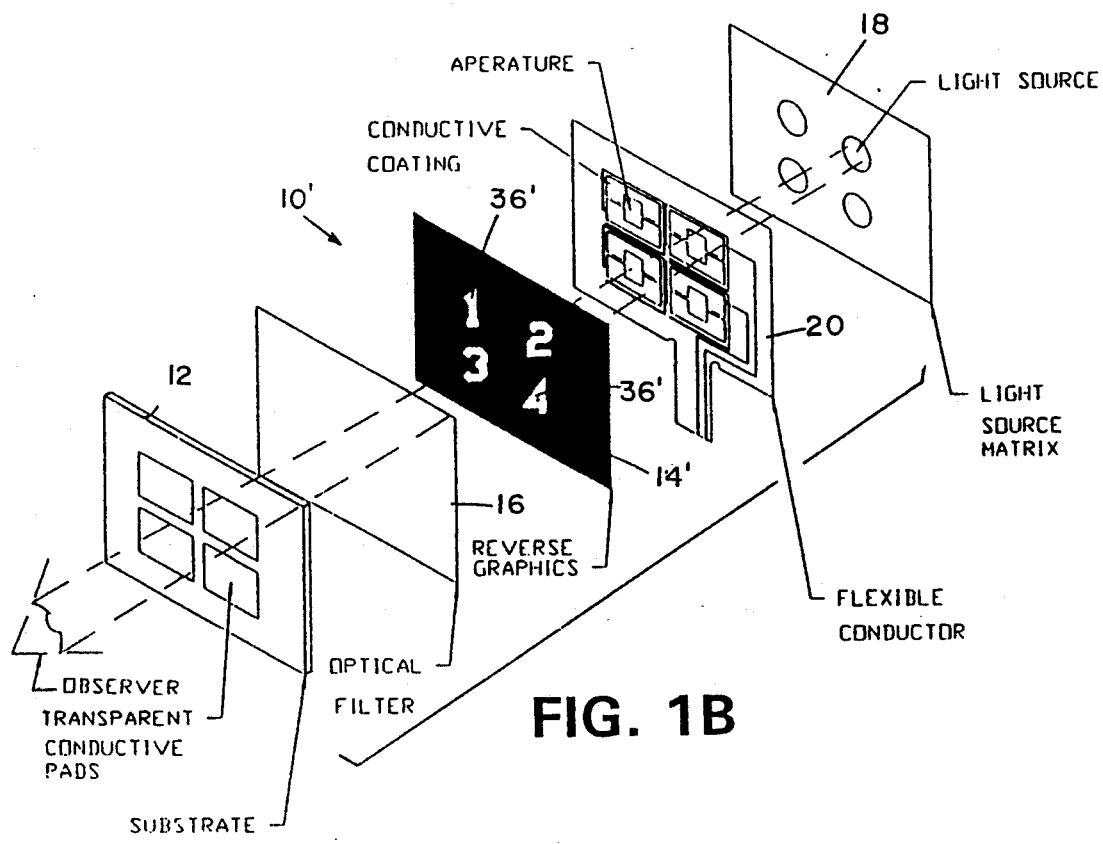
FIG. 1B is an exploded perspective view of a touch panel using a different form of graphic symbols.

The embodiment illustrated in FIG. 1B is similar to that in FIG. 1A except that the graphic layer 14' has a substantially opaque background with the graphic characters 36 being transparent, removed portions of the background. In this manner, the particular character or symbol 36' is visible through substrate 12 when the juxtaposed light source 34 is actuated and has a tint determined by the transmissive characteristics of optical filter 16.

Figure 2A:
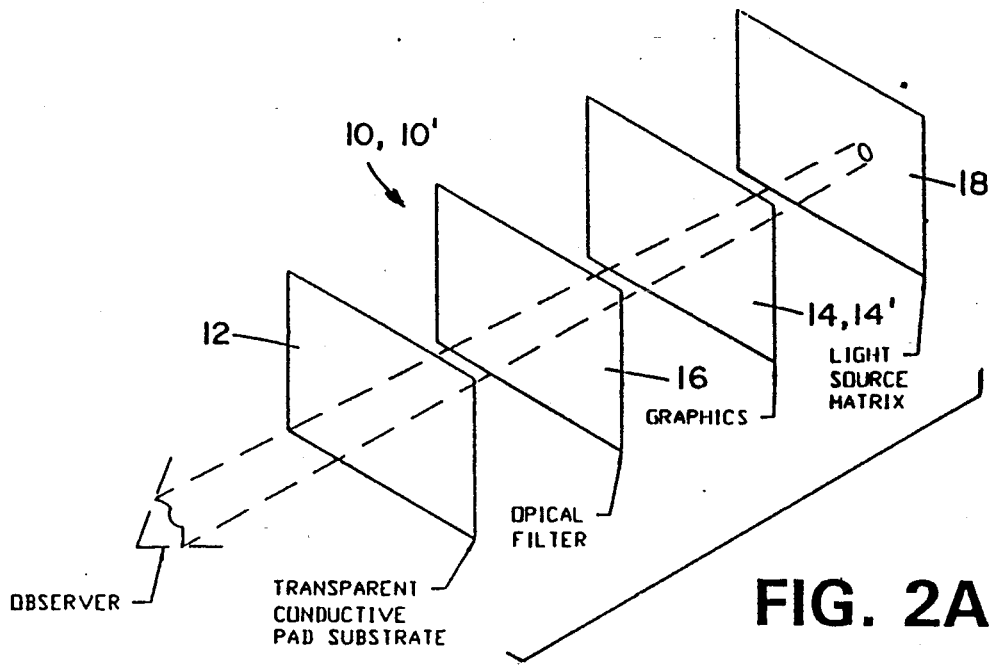
FIG. 2A is an illustration of an arrangement of an optical filter and a graphics layer.
Figure 2B:
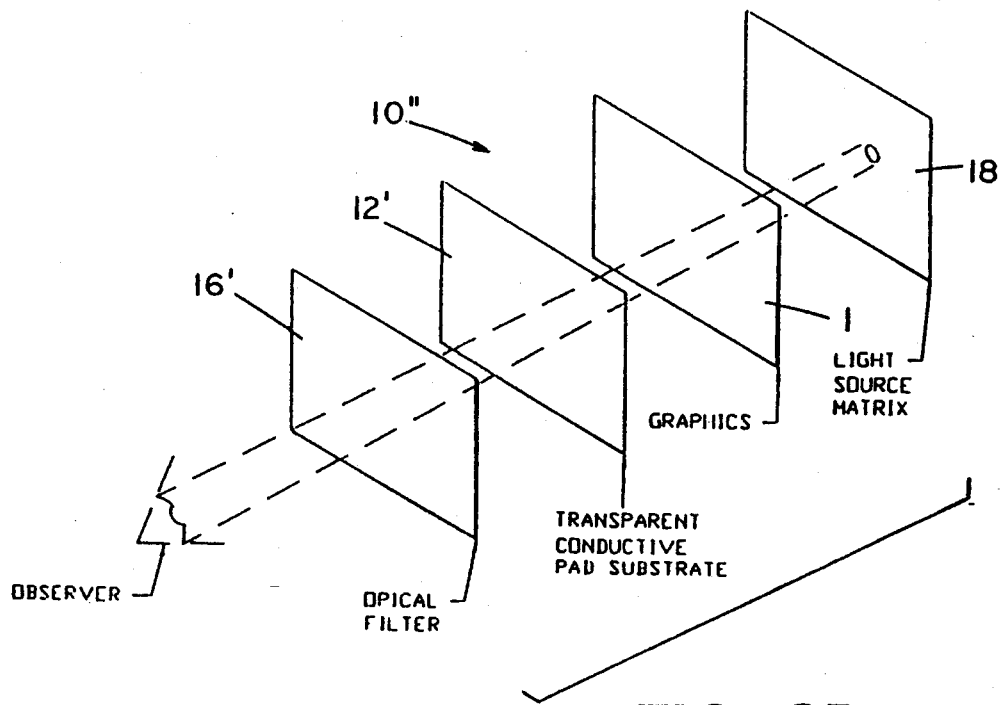
FIG. 2B is an illustration of another arrangement of an optical filter and a graphics layer.

The arrangement of components cf touch sensor panels 10 and 10', illustrated in FIGS. 1A and 1B are illustrated in FIG. 2A. Touch panels 10, 10' each include a substantially transparent substrate 12 with an optical filter 16 applied behind substrate 12, a graphic layer 14, 14' over filter 16 and light source matrix 18 behind the graphic layer. The application of an optical filter behind substrate 12 creates the appearance of a substantially homogeneous plain colored panel until one or more of the light sources in light matrix 18 is actuated, at which time an alpha-numeric character or icon graphic symbol 36, 36' appears on substrate 12. In touch panel 10", illustrated in FIG. 2B, optical filter 16' is not positioned between substrate 12' and graphics layer 14, 14'. Instead, in one preferred embodiment, optic filter 16' may be a colored tint applied to substrate 12' during its manufacture or may be a film applied on the outer surface of substrate 12'. The overall effect of a substantially homogeneous touch panel when no light sources are actuated, but with characters or symbols appearing when the associated light source is actuated, is provided with the embodiment illustrated in FIG. 2B.

Figure 3:
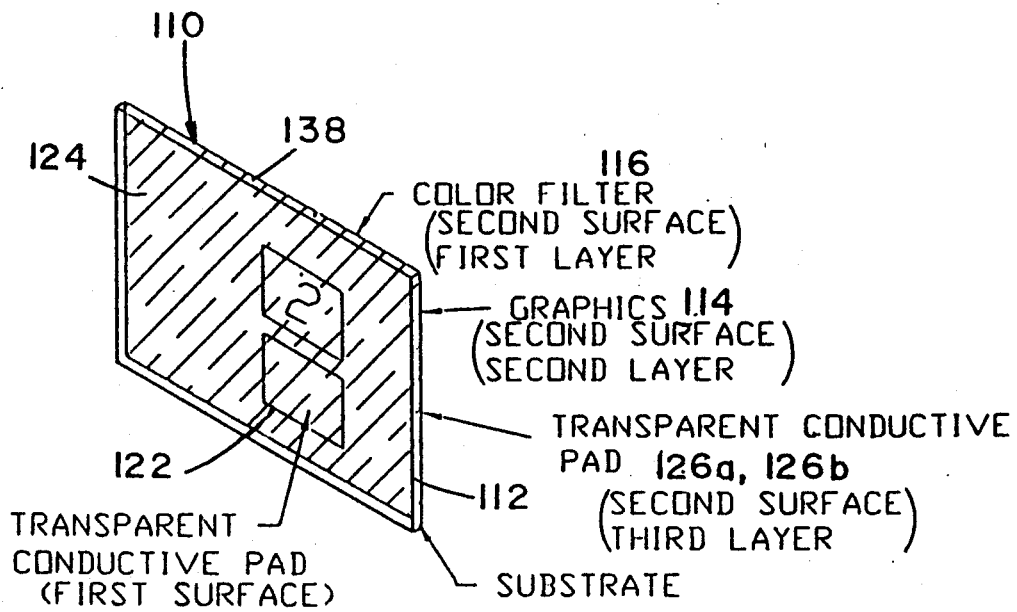
FIG. 3 is perspective illustrating an alternative embodiment of the invention.
Figure 4:
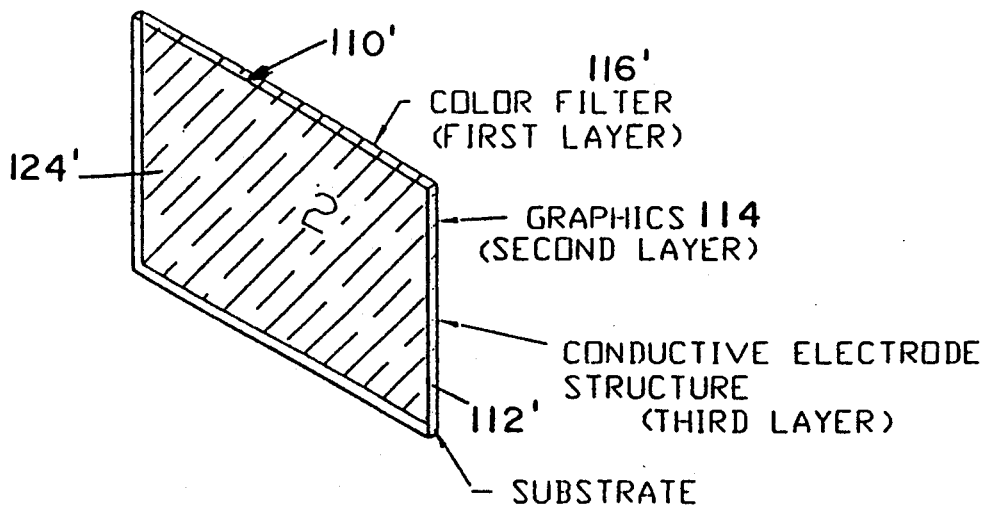
FIG. 4 is an illustration of another alternative embodiment of the invention.

FIGS. 3 and 4 illustrate embodiments of a touch panel in which all of the required layers are applied directly to the dielectric substrate. By reference to FIG. 3, a touch sensor panel 110 is provided having substrate 112 in which transparent conductive touch pads 122 are applied on a user contacting touch surface 124. The optical filter 116 is applied as a first layer coating on a second surface 138 of substrate 112 or may be a tint applied directly to the material from which substrate 112 is manufactured. A graphics layer 114 is applied as a second layer over the filter 116. Sensing pads 126a, 126b are deposited directly over graphics layer 114 using conventional deposition techniques. In this configuration, sensing pads 126a, 126b will be substantially transparent to transmit the light from light source matrix 118. Touch sensor panel 110 has the advantage of unitary design. Electrical connection with conducting pads 126a, 126b may be provided by adhering conducting pins to the associated pads by known techniques for applying electrical contacts to the conductors in heated windshields and the like.

Touch sensor panel 110' illustrated in FIG. 4 is similar to the touch panel illustrated in FIG. 3 except the touch pad has been removed from the user touch surface 124'. As previously set forth, a conductive touch pad may not be required in certain applications in which alternative capacity sensing techniques are utilized in the associated sensing circuit (not shown). In such a system, the conductive touch pad is eliminated from the front surface and replaced by a second surface conductive electrode structure. Touch panels 110, 110' may additionally include a conductive electrode structure 120 having an interim insulating layer over a first layer of conductive pads structure in order to provide for either a second layer of conductive pads or cross-overs for the conductive leads extending to the conductive sensor pads.

The structure set forth above hides the appearance of the graphics layer except when one or more light sources is illuminated. This is believed to occur because, when the touch sensor panel is positioned over a light-tight enclosure, the graphic layer is totally, uniformly darkened without a light source being illuminated. The optical filter provides a lightened appearance to the touch sensor panel, which otherwise would appear very dark. In fact, the touch sensor panel takes on a light appearance without a hint of the dark graphics layer. Such a touch sensor panel has exceptionally pleasing characteristics both in a "sleep" mode, in which substantially all of the back light sources are deactuated, and in a "use" mode when one or more of the back light sources is actuated. The result is a touch sensor panel that blends into the surroundings and is essentially totally unobtrusive until placed into use.

Changes and modifications in the specifically described embodiments can be carried out without departing from the principles of the invention. For example, by providing a non-neutral colored optical filter, the alpha-numeric character or icon graphic symbols, or their background, will take on the color of the optical filter. By providing a neutral-colored optical filter, another filter may be applied in front of the back-lights to provide a non-neutral coloration to the symbols or their background. The protection afforded the invention is intended to be limited only by the scope of the appended claims, as interpreted according to the principles of patent law, including the Doctrine of Equivalents.

The embodiment of the invention in which an exclusive property or privilege is claimed are defined as follows:

1. A capacitive touch sensor panel comprising:
    a generally planar substrate having a user contacting first surface and an opposite second surface;
    a graphics layer behind said second surface defining user readable graphic symbols;
    a light source behind said graphics layer and including individual selectively actuatable light elements behind particular ones of said graphic symbols;

an optical layer between said first surface and said graphics layer and adapted to transmitting selected light frequencies in order to project images of particular graphic symbols juxtaposed with actuated light elements and to impart a homogeneous appearance to portions of said substrate overlying nonactuated light elements; and capacitive sensor means juxtaposed with said graphic symbols in a manner that functions associated with the graphic symbols are invoked by actuation of a portion of said capacitive sensor means overlaying the corresponding one of said graphic symbols.

2. The touch sensor panel in claim 1 wherein said optical layer includes a distinct filter layer adjacent said second surface.

3. The touch sensor panel in claim 2 wherein said filter layer is a colored epoxy layer applied to said second surface.

4. The touch sensor panel in claim 2 wherein said filter layer is a colored glass frit applied to said second surface.

5. The touch sensor panel in claim 1 wherein said optical layer includes a tint applied to material defining said substrate.

6. The touch sensor panel in claim 1 wherein said graphics layer is substantially opaque and said graphic symbols are defined by portions of said graphics layer being removed.

7. The touch sensor panel in claim 1 wherein said graphics layer is substantially transparent and said graphic symbols are opaque.

8. The touch sensor panel in claim 1 wherein said capacitive sensor means includes at least one conductive sense pad juxtaposed with one of said graphic symbols.

9. The touch sensor panel in claim 8 wherein said capacitive sensor means includes a dielectric layer supporting said conductive sense pad positioned between said graphic layer and said light source.

10. The touch sensor panel in claim 8 wherein said capacitive sensor means further includes at least one transparent conductive touch pad on said user contacting first surface juxtaposed with said conductive sense pad.

11. The touch sensor panel in claim 8 wherein said conductive sense pad is substantially transparent.

12. The touch sensor panel in claim 8 wherein said conductive sense pad has a cutout area overlying said one of said graphic symbols.

13. A capacitive touch sensor panel comprising:
a generally planar substrate having a user-contacting first surface and an opposite second surface;
graphics layer having alpha-numeric characters, icons or other graphic devices behind said second surface of said substrate defining user readable graphic symbols;
a flexible substrate adjacent said graphics layer and including a plurality of electrically conductive sensing pads juxtaposed with said graphic symbols;
a plurality of light sources behind said flexible substrate, each of said light sources being juxtaposed with one of said electrically conductive sensing pads and being selectively actuatable; and
said planar substrate having optical transmission characteristics at selected light frequencies in order to project images of said alpha-numeric characters, icons or other graphic devices juxtaposed with actuated ones of said light sources and to impart a homogeneous appearance to portions of said substrate overlying nonactuated ones of said light sources.

14. The touch sensor panel in claim 13 wherein said planar substrate includes a colored layer adhered to said second surface in order to establish said optical transmission characteristics.

15. The touch sensor panel in claim 14 wherein said colored layer is an epoxy.

16. The touch sensor panel in claim 14 wherein said colored layer is a glass frit.

17. The touch sensor panel in claim 13 including a tint applied to the material defining said planar substrate in order to establish said optical transmission characteristics.

18. The touch sensor panel in claim 13 wherein said graphics layer is substantially opaque and said graphic symbols are defined by portions of said graphics layer being substantially transparent.

19. The touch sensor panel in claim 13 wherein said graphic symbols are opaque.

20. The touch sensor panel in claim 13 including a plurality of transparent conductive touch pads applied to said first surface, each of said touch pads overlying one of said sensing pads.

21. The touch sensor panel in claim 13 wherein said sensing pads are substantially transparent.

22. The touch sensor panel in claim 13 wherein each of said sensing pads has a cutout area overlying the associated one of said graphic symbols.

* * * * *